(12) United States Patent
Launtz

(10) Patent No.: US 6,229,088 B1
(45) Date of Patent: May 8, 2001

(54) LOW PROFILE ELECTRONIC ENCLOSURE

(75) Inventor: Jack E. Launtz, Kane, PA (US)

(73) Assignee: Legacy Technologies, Inc., Kane, PA (US)

( * ) Notice: Subject to any disclaimer, the term of this patent is extended or adjusted under 35 U.S.C. 154(b) by 0 days.

(21) Appl. No.: 09/226,431

(22) Filed: Jan. 6, 1999

Related U.S. Application Data

(60) Provisional application No. 60/071,058, filed on Jan. 9, 1998.

(51) Int. Cl.[7] ............... H01J 15/00; H01J 5/00
(52) U.S. Cl. ............ 174/50.51; 174/50.6; 174/52.5; 174/52.3; 174/50.61; 257/699; 257/708
(58) Field of Search .............. 174/52.3, 52.4, 174/50.5, 50.51, 50.61, 52.5, 52.6, 50.6; 257/698, 699, 708

(56) References Cited

U.S. PATENT DOCUMENTS

| | | |
|---|---|---|
| 2,444,312 | 6/1948 | Roberds ............... 174/50.5 |
| 2,976,465 | 3/1961 | Jensen ............... 257/699 |
| 3,184,534 | 5/1965 | Jensen ............... 174/52.3 |
| 3,419,763 | 12/1968 | Beaudouin ............... 257/723 |
| 3,546,363 | 12/1970 | Pryor ............... 174/52.5 |
| 3,726,987 | 4/1973 | Pryor et al. ............... 174/50.61 |
| 3,816,847 | 6/1974 | Nagao ............... 257/98 |
| 3,857,993 * | 12/1974 | Gregory ............... 174/52.3 |
| 4,706,106 | 11/1987 | Shiba et al. ............... 257/682 |
| 5,206,460 | 4/1993 | Yang ............... 174/52.1 |
| 5,367,124 | 11/1994 | Hoffman et al. ............... 174/52.4 |

* cited by examiner

Primary Examiner—Anthony Dinkins
Assistant Examiner—Hung V Ngo
(74) Attorney, Agent, or Firm—Lovercheck and Lovercheck

(57) ABSTRACT

An electronic enclosure having a cover and a base member reduced in height by providing the necessary height on the decoupling area around and generally in the same vertical space as is occupied by the thickness of glass provided to hermetically seal the enclosure. The glass is formed inside and kept away from the decoupling area by an inner ring fixed to the base member, or by a tool which is removed after the glass has been applied to seal the enclosure.

16 Claims, 5 Drawing Sheets

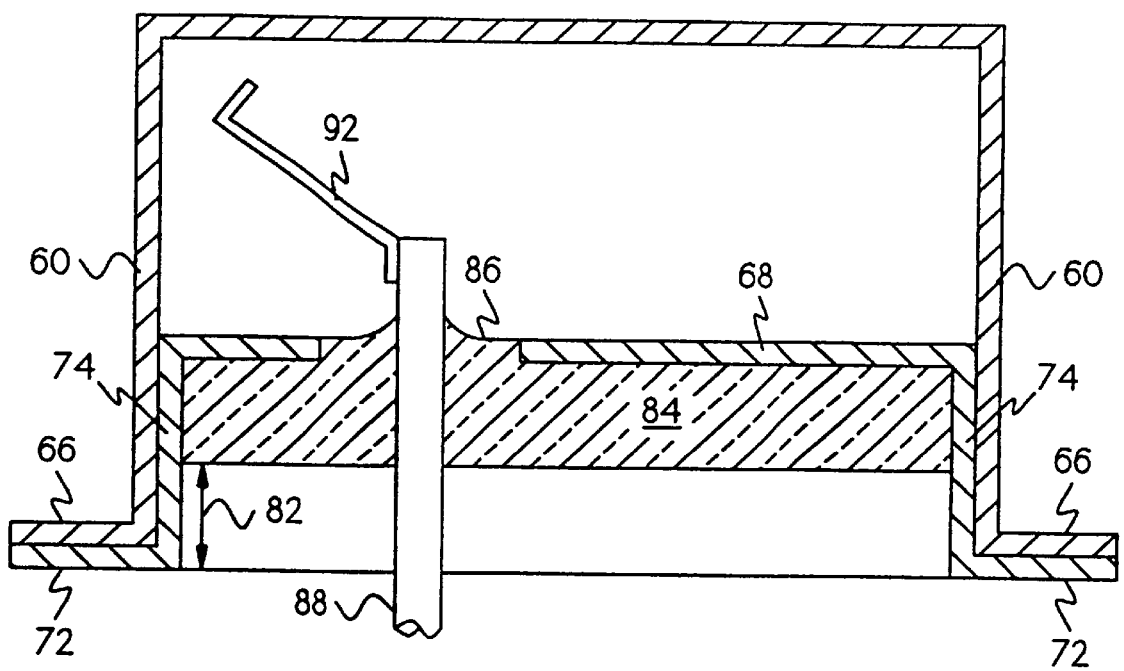
Fig_8

LOW PROFILE ELECTRONIC ENCLOSURE

REFERENCE TO PRIOR APPLICATION

This application claims the benefit of U.S. Provisional Application Ser. No. 60/071,058 filed Jan. 9, 1998.

BACKGROUND OF THE INVENTION

This invention relates to leak-free enclosures to support electronic device and more specifically to an enclosure construction that will allow a reduction in the overall height of the enclosure.

The electronics industry requires vast quantities of miniature enclosures to support and protect electronic crystals, transistors, and other devices. These enclosures consist of "bases" or "headers" and matching "cans" or "covers". These enclosures provide protection from atmosphere, moisture, and other factors that can degrade their performance of electronic devices. The base supports and protects the active component or components in a hermetic or leak-free environment while providing a method for signals to pass into and out of the device by means of any number of insulated wires or pins. One of the most reliable and cost-effective methods of constructing bases or headers employs the use of certain glass and metal alloys that can be bonded to each other through the use of various processes. These processes produce a "finished" base that is ready to receive the active device.

After the active device is installed, a "can" or "cover" is attached over the base to complete the enclosure. There are various methods for attaching the cover which must also form a hermetic seal with the base. Methods typically employed are: Attachment by a relatively low temperature solder, resistance welding, and cold-welding.

Each of the "closure" methods have applications, but the cold-welding method has been found to be a preferred method, especially in the electronic frequency control industry, as it neither generates nor requires heat, current, flux, or other potentially detrimental factors.

The cold-weld method as commonly used in the frequency control industry was developed in the 1960's. The bases are designed around a metal stamping manufactured from copper-clad Kovar material. This material is typically 0.010" thick and consists of a layer of 0.007" Kovar physically bonded to a 0.003" layer of copper. The Kovar alloy is a preferred material to bond to the glass employed, while the copper layer provides the properties required for a reliable cold-weld seal to the cover.

Cold-weldable bases for the electronics industry in general, and the frequency-control industry in particular, have been manufactured for over thirty years. These bases (Military types HC-35, 37, 42, and 43 for example) are 0.100" high. This height is necessary to provide a thickness of glass sufficient to effect a hermetic seal while providing a decoupling area in proximity to a flange where the cold-weld is effected. This decoupling area is intended to allow the movement of metal that occurs when the base and cover are cold-welded. Without this glass-free decoupling area, mechanical stresses from the cold-welding operation would crack and destroy or compromise the hermeticity of the completed component.

Applicant is aware of the following U.S. Pat. Nos.: 2,444,312; 2,976,465; 3,184,534; 3,419,763; 3,546,363; 3,726,987; 3,816,847; 4,706,106; 5,206,460; and, 5,367,124.

SUMMARY OF THE INVENTION

The necessity of this decoupling area requires the base to be almost twice the thickness that otherwise would be required. Due to the constant pressures in the electronics industry for smaller components, a reduction in the height of the base which allows the use of a shorter cover offers significant advantages.

The present invention utilizes two separate metal stampings rather than one which is now common. The top stamping is virtually identical to the currently used stamping except that it is approximately 0.060" high rather than the current 0.1001" height. The unique feature is a flanged Kovar inner ring which is welded into the underside of the first stamping. Glass is bonded to the Kovar surfaces of both stampings, ensuring a hermetic seal while providing a suitable decoupling area sufficient to withstand the stresses associated with the subsequent cold-welding closure method. Glass thickness at critical areas remains equal to, or greater than, current designs to preserve or surpass currently achievable hermeticity levels, but with a package 50–60% of the height of current designs, and with no increase in the "footprint" size of the device.

It is an object of this invention to reduce the height of the base while retaining the necessary height to provide an adequate decoupling area and at the same time, retaining adequate glass thickness to preserve hermetically.

It is another object of the present invention to provide a low profile electronic enclosure that is simple in construction, economical to manufacture and simple and efficient to use.

With the above and other objects in view, the present invention consists of the combination and arrangement of parts hereinafter more fully described, illustrated in the accompanying drawing and more particularly pointed out in the appended claims, it being understood that changes may be made in the form, size, proportions and minor details of construction without departing from the spirit or sacrificing any of the advantages of the invention.

BRIEF DESCRIPTION OF THE DRAWING(S)

FIG. 8 is a cross sectional side view of an enclosure with a decoupling area disposed below the sealing glass as is known in the prior art.

DESCRIPTION OF THE PREFERRED EMBODIMENT(S)

Figure 1:
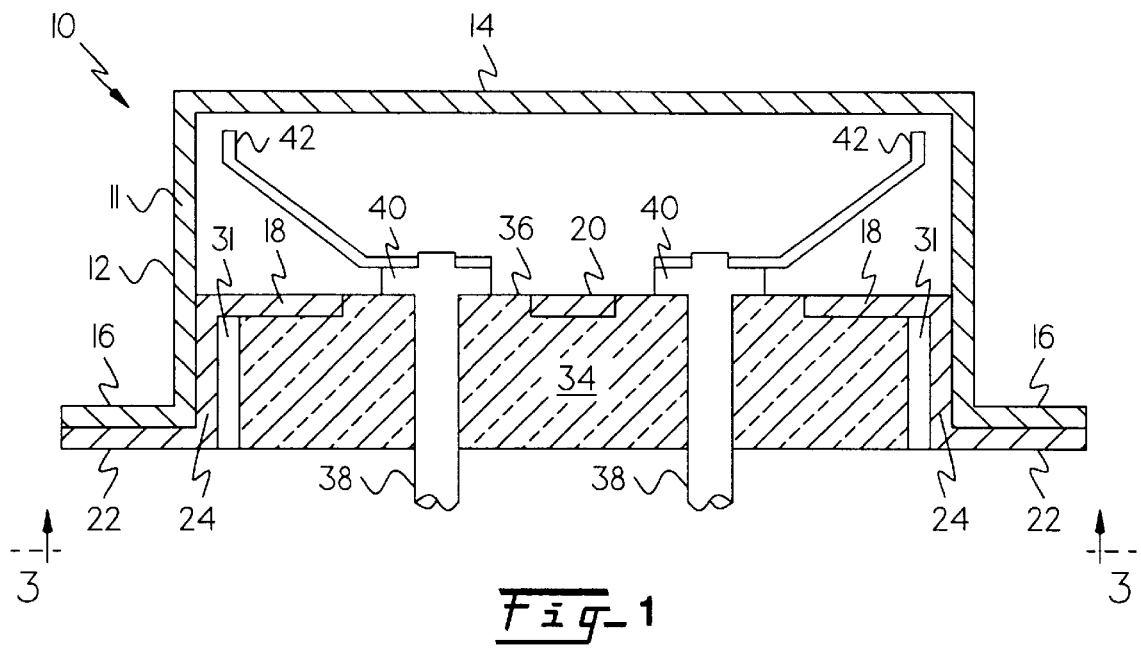
FIG. 1 is a cross sectional side view of an enclosure with a decoupling area around the perimeter of the sealing glass according to the invention.

Now with more particular reference to the drawings, enclosure 10 is made up of cover 11 and base member 18.

Cover 11 has side or sides 12 which forms the perimeter of enclosure 10 which may be generally cylindrical or polygonal in shape. Cover 11 is closed at a first end by top 14. The second end of side 12 has outwardly extending flange 16 attached thereto.

Base member 18 is made up of top 20 that fits inside cover 11 and extends outwardly therefrom. Base member 18 has side or sides 24 which rests tightly against the inside surface of the lower portion of side 12. Base member 18 has outwardly extending flange 22 which rests firmly against outwardly extending flange 16. Outwardly extending flange 22 being attached to the lower side of side 24. The enclosed area of base member 18 contains glass insulator 34. Base member 18 has any number of holes 36 in its top 20 through which feed wires 38 may extend. Feed wires 38 may terminate in widened sections 40 adjacent their upper end. Widened sections 40 will have attached thereto supporting structure 42 which will support electronic components inside sealed enclosure 10.

Decoupling area 31 is disposed generally around glass insulator 34 and extends around the entire perimeter between glass insulator 34 and side 24 of base member 18. In one embodiment as shown in FIG. 1, decoupling area 31 may be formed by a tool or insert 50 which is removed after glass insulator 34 is placed in the base member to leave the decoupling area free of the glass material.

Figure 2:
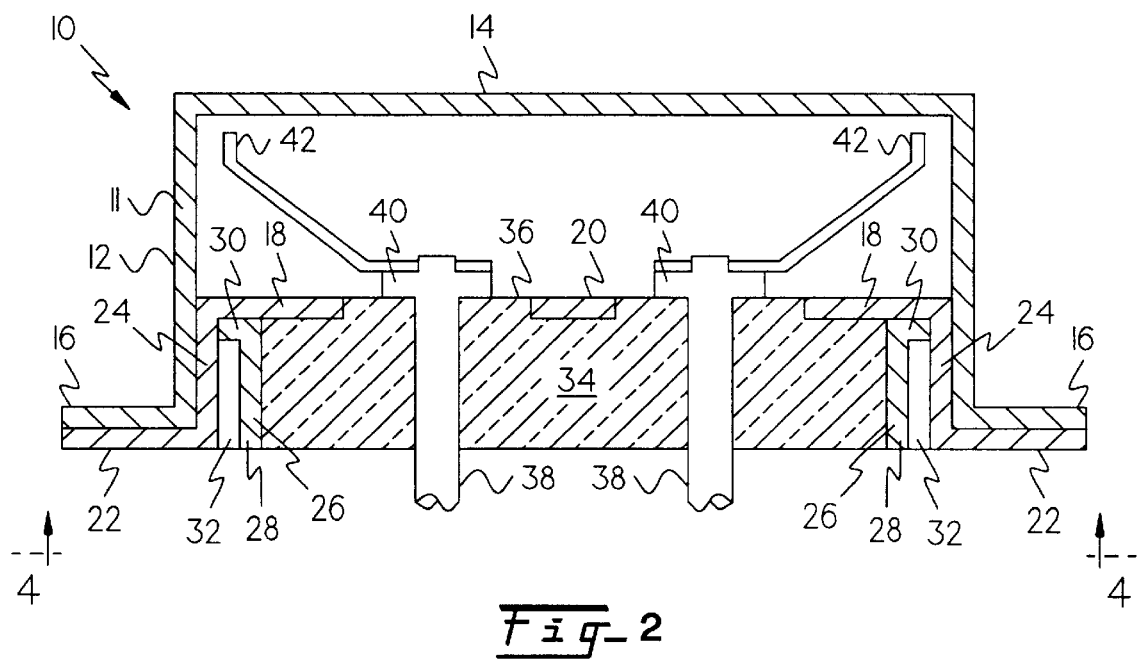
FIG. 2 is a cross sectional side view of an enclosure with a decoupling area around the perimeter of the sealing glass with a metal ring separating the SEALING glass from the decoupling area according to the invention.

In another embodiment as shown in FIG. 2, inner ring 26 is affixed to base member 18 by welding or other suitable means. Inner ring 26 consisting of side member 28 which extends around the perimeter of glass insulator 34 and has leg 30 that is attached to top 20 and to side 24 of base member 18. Side 24 and side 28 have a space between them forming decoupling.

Figure 3:
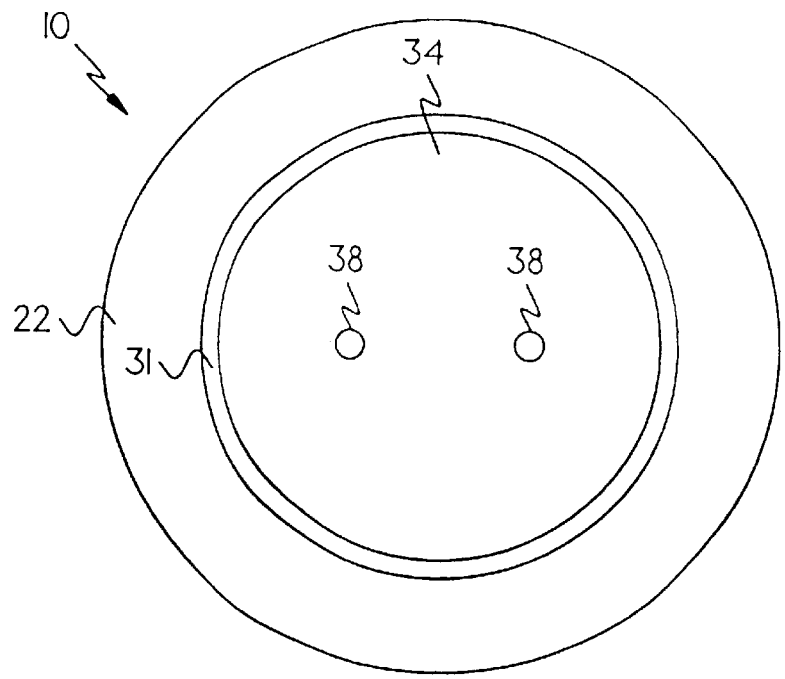
FIG. 3 is a bottom view of the enclosure shown in FIG. 1 with a decoupling area around the perimeter of the sealing glass according to the invention.
Figure 4:
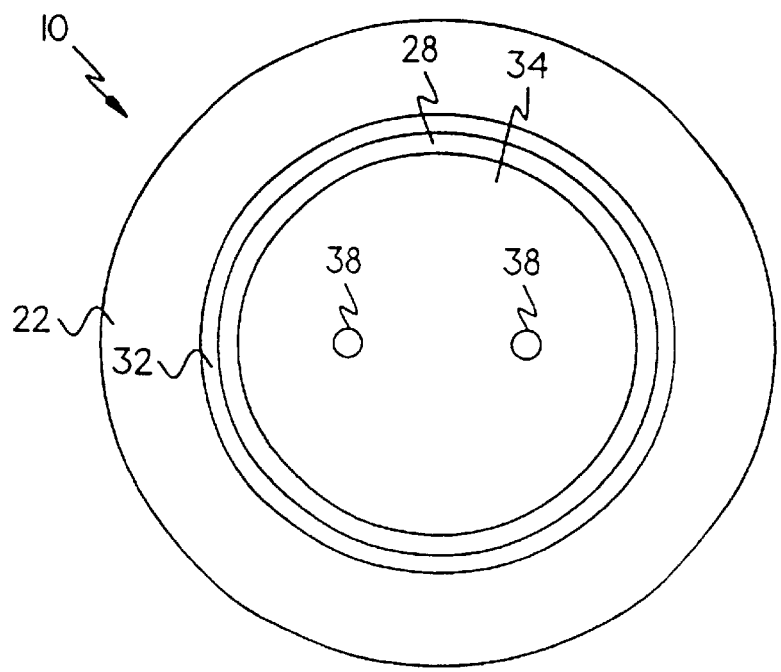
FIG. 4 is a bottom view of the enclosure shown in FIG. 2 with a decoupling area around the perimeter of the sealing glass with a metal inner ring separating the sealing glass from the decoupling area according to the invention.
Figure 5:
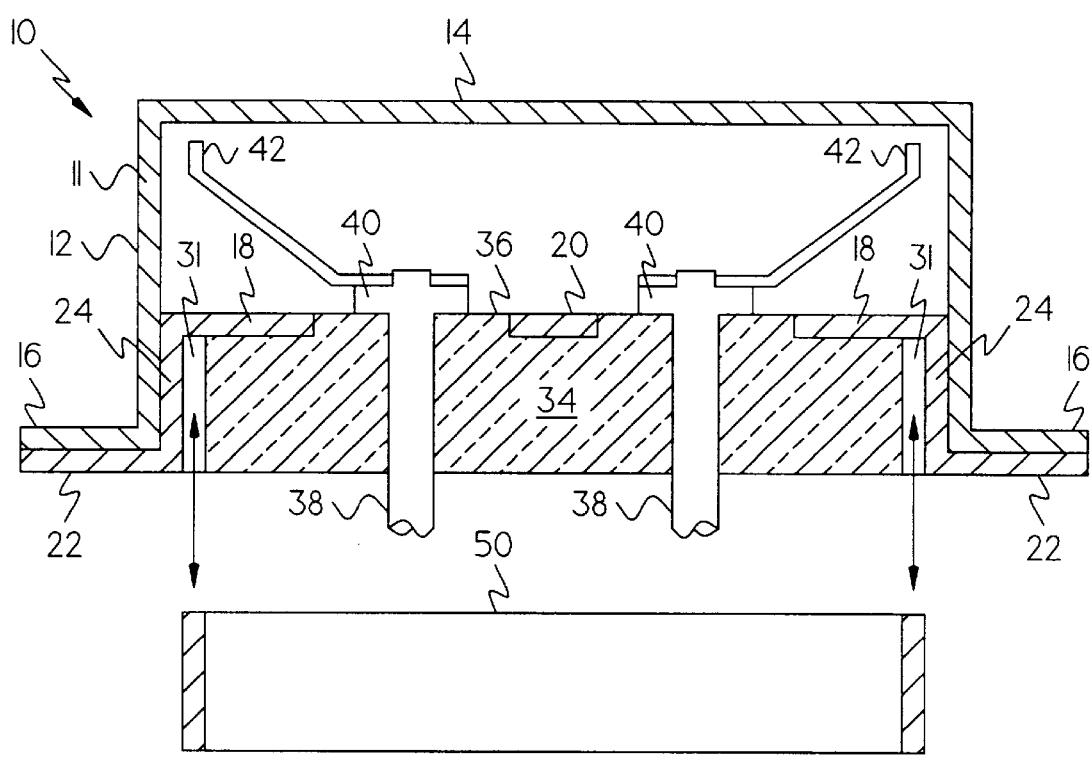
FIG. 5 is a cross sectional side view of an enclosure with a decoupling area around the perimeter of the sealing glass and showing a tool that forms the sealing glass and is then removed from the enclosure.
Figure 6:
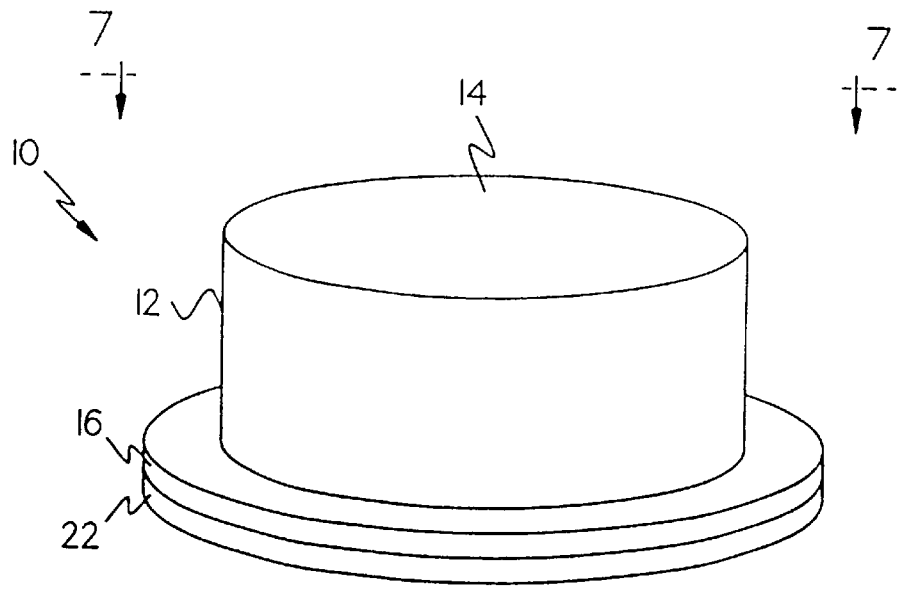
FIG. 6 is an isometric side view of an enclosure according to the invention.
Figure 7:
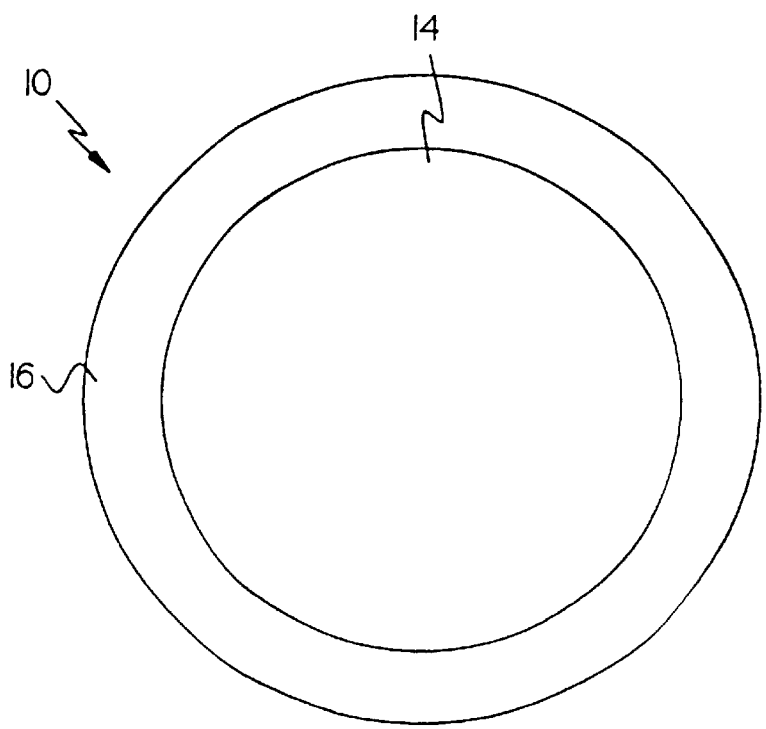
FIG. 7 is a top view of an enclosure according to the invention.

The advantage of the present invention is illustrated by FIG. 3 in which cover 60 must be made taller than required by the invention to accommodate base stamping 68 which has side 74 which must be tall enough to accommodate the height of a sufficient glass insulator 84 and, there below, must accommodate the additional height of a sufficient decoupling area 82. The invention places the height of the decoupling area and the height of the glass insulator at generally the same height allowing for a shorter overall height of the enclosure.

As shown, feed wire 88 extends through hole 86 in base stamping 68 and has supporting structure 92 attached to its upper end. Cover 60 has outwardly extending flange 66 integrally attached to its lower end. Base stamping 68 has outwardly extending flange 72 integrally attached at its lower end.

The foregoing specification sets forth the invention in its preferred, practical forms but the structure shown is capable of modification within a range of equivalents without departing from the invention which is to be understood is broadly novel as is commensurate with the appended claims.

The embodiments of the invention in which an exclusive property or privilege is claimed are defined as follows:

1. A sealed enclosure comprising a cover and a base member that fits inside the cover;
   a glass insulator spaced inwardly from the perimeter of the base member and filling an area of the interior of the base member and occupying a height inside said base member;
   a decoupling area inside said base member extending substantially around the perimeter of the base member between the inside of the base member and the outside of the glass insulator and occupying a height therein.

2. The sealed enclosure recited in claim 1 wherein the cover comprises a top, a side which extends generally downwardly from the perimeter of the top, and a flange which extends generally outwardly from the lower end of the side.

3. The sealed enclosure recited in claim 1 wherein the base member comprises a top, a side which extends generally downwardly from the perimeter of the top, and a flange which extends generally outwardly from the lower end of the side.

4. The sealed enclosure recited in claim 1 further comprising at least one hole in the base member.

5. The sealed enclosure recited in claim 4 further comprising at least one feed wire extending through said at least one hole in the base member.

6. The sealed enclosure recited in claim 4 wherein an inner ring comprises a leg that is attached to the top of the base member and to the side of the base member.

7. The sealed enclosure recited in claim 1 further comprising an inner ring that is attached to the base member spaced inwardly from the side of the base member;
   the decoupling area extending substantially around the perimeter of the base member between the inside of the base member and the outside of the inner ring;
   the glass insulator substantially filling the interior of the inner ring.

8. The sealed enclosure recited in claim 7 wherein the inner ring is attached to the base member by welding.

9. The sealed enclosure recited in claim 1 wherein the cover and the base member are attached by cold welding.

10. A sealed enclosure comprising a cover and a base member that fits inside the cover;
    an inner ring attached to the base member spaced inwardly from the side of the base member;
    a decoupling area extending substantially around the perimeter of the base member between the of the base member and the outside of the inner ring.

11. The sealed enclosure recited in claim 10 further comprising a glass insulator substantially filling the interior of the inner ring.

12. The sealed enclosure recited in claim 11 further comprising at least one feed through wire extending through at least one hole in the base member.

13. The sealed enclosure recited in claim 10 further comprising at least one hole in the base member.

14. The sealed enclosure recited in claim 10 wherein the cover and the base members are attached by cold welding.

15. The sealed enclosure recited in claim 10 wherein the inner ring further comprises a leg that is attached to the top of the base member and to the side of the base member.

16. The sealed enclosure recited in claim 10 wherein the inner ring is attached to the base member by welding.

* * * * *